(12) United States Patent
Cheng et al.

(10) Patent No.: US 6,276,598 B1
(45) Date of Patent: Aug. 21, 2001

(54) METHOD AND APPARATUS FOR BALL PLACEMENT

(75) Inventors: Chi Wah Cheng; Alfred Ka On Yue; Chiu Fai Wong, all of Kowloon (HK)

(73) Assignee: ASM Assembly Automation Ltd. (HK)

( * ) Notice: Subject to any disclaimer, the term of this patent is extended or adjusted under 35 U.S.C. 154(b) by 0 days.

(21) Appl. No.: 09/352,368

(22) Filed: Jul. 13, 1999

(51) Int. Cl.⁷ .................................................. B23K 37/04
(52) U.S. Cl. ........................ 228/245; 228/49.5; 228/47.1
(58) Field of Search ..................... 228/180.22, 245, 228/248.1, 253, 47.1, 49.5, 49.1, 43; 438/613; 257/737, 738; 221/211

(56) References Cited

U.S. PATENT DOCUMENTS

| | | |
|---|---|---|
| 5,431,332 | 7/1995 | Kirby et al. . |
| 5,467,913 * | 11/1995 | Namekawa et al. . |
| 5,620,927 | 4/1997 | Lee . |
| 5,655,704 | 8/1997 | Sakemi et al. . |
| 5,704,536 | 1/1998 | Chen et al. . |
| 5,782,399 * | 7/1998 | Lapastora . |
| 5,839,191 * | 11/1998 | Ecomony et al. . |
| 5,839,641 | 11/1998 | Teng . |

* cited by examiner

*Primary Examiner*—Tom Dunn
*Assistant Examiner*—Jonathan Johnson
(74) *Attorney, Agent, or Firm*—Burns, Doane, Swecker & Mathis, L.L.P.

(57) ABSTRACT

A method and apparatus are described for placing a plurality of balls in a predetermined array. The method and apparatus are particularly suitable for transferring solder balls to a ball grid array package. In the method the balls are transferred from a supply means 1 to a template 2 in which the balls are positioned in the desired array before being picked up by a ball pick head 3 for transfer to the final position while remaining in the desired array.

12 Claims, 2 Drawing Sheets

METHOD AND APPARATUS FOR BALL PLACEMENT

Figure 1:
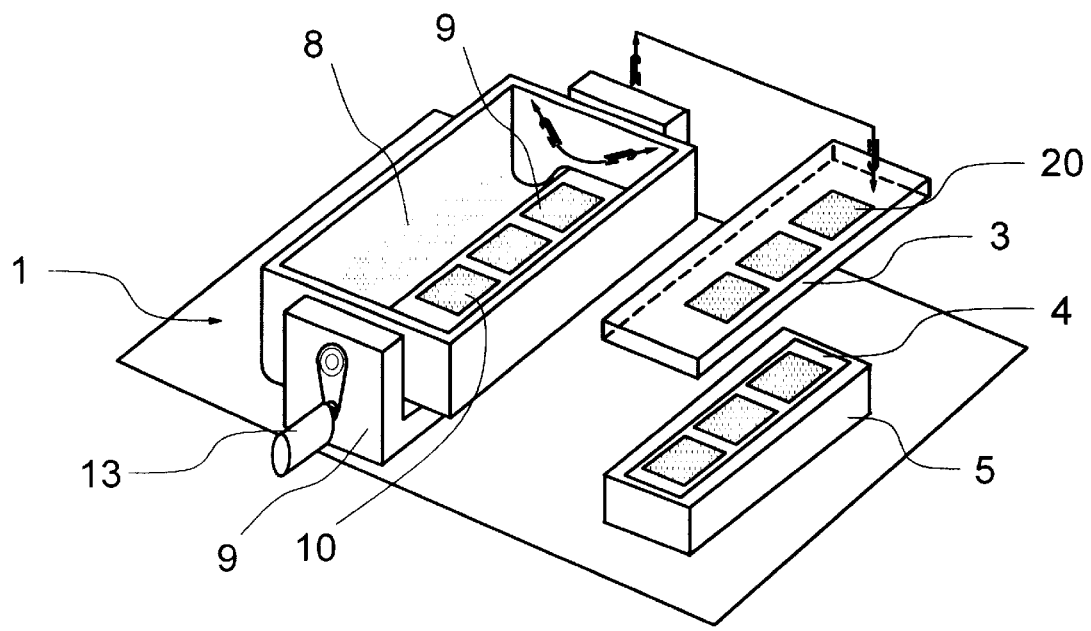

This invention relates to a method and apparatus for the placement of small balls of material in an array. The invention is particularly useful, but not exclusively intended, for the placement of solder balls on a ball pick head for subsequent transfer to a ball grid array (BGA).

BGA techniques have become more common in recent years for connecting high density IC components onto circuit boards. A regular array of fluxed solder balls is deposited on the circuit board at points where the leads of an IC component may be desired to be connected. An IC component may then be mounted on the board and connections are made between the leads of the component and the solder balls contacted by those leads.

To achieve this end, in a ball grid array technique droplets of flux and solder balls must be transferred to a substrate where they are deposited in a predetermined array. One way of achieving this is to locate a stencil over the circuit board. The stencil is formed with a plurality of apertures in the same configuration as the desired array of solder balls on the circuit board. The stencil is located over the circuit board in such a position that the apertures are located over the intended locations of the solder ball on the circuit board. A supply of solder balls is then introduced over the stencil such that solder balls pass through the apertures in the stencil onto the circuit board in the proper configuration. Examples of such stencil based techniques are to be found in U.S. Pat. Nos. 5,431,332, 5,655,704, 5,620,927, 5,839,641 and 5,704,536. A major disadvantage with this technique, however, is that it requires very precise location of the stencil above the circuit board which may be difficult to achieve when the pitch between solder balls is very small as will normally be the case.

An alternative technique is to use a ball pick head. The ball pick head is used for transferring the solder balls to the substrate and is designed to carry the balls in the same array configuration as is required on the substrate and then subsequently to deposit the balls on the substrate. It is important, indeed essential, that all locations on the circuit board intended to be provided with a solder ball are so provided, since otherwise if a solder ball is missing a IC component lead may not be properly connected to the board and the entire circuit board may be useless.

Conventionally the ball pick head is formed with a plurality of locations for receiving solder balls, these locations being disposed in the same array configuration as the desired configuration of solder balls on the circuit board. The ball pick head must therefore be provided with solder balls such that each location is provided with one (and only one) solder ball. If any location is missing its solder ball, the corresponding location on the circuit board will not be provided with a solder ball. Matters are not much better if a ball receiving location receives two solder balls which is undesirable. Achieving these aims is difficult and expensive. Often means must be provided to check that each ball receiving location is provided with a solder ball before the supply of solder balls to the board, or the board itself must be checked after the supply of balls and before an IC component is mounted thereto.

However, the solder balls must firstly be transferred to the ball pick head before they can be deposited on the substrate. In the prior art, the ball pick head is formed with ball receiving locations that hold solder balls in place on the ball pick head by suction. In such prior art, one conventional technique is for the ball pick head to be simply lowered into a container having a supply of solder balls such that the solder balls are drawn to the ball receiving locations by suction and held therein. Examples of such a technique are to be found in U.S. Pat. Nos. 5,695,667, 5,753,904, 5,615,823, 5,657,528, 5,601,229, 5,680,984, 5,750,199, 5,831,247, and 5,768,775. While relatively simple, this method has a number of drawbacks. The most important of these is that it is very difficult to ensure that every single ball locating means receives one, and only one, solder ball. When the ball pick head is lowered into the supply of solder balls, it may happen that if by the random distribution of the balls in the container there is no solder ball close to one particular ball locating means, the suction may be insufficient to attract a solder ball thereto. Conversely if other ball locating means have a number of solder balls close thereto, more than one solder ball may be drawn to that ball locating means.

According to the present invention there is provided apparatus for supplying balls in a predetermined array, comprising: supply means for holding a supply of balls, means for transferring balls from said supply means to an intermediate position in which said balls are disposed in said predetermined array, and means for transferring said balls from said intermediate position to a final position while remaining disposed in said predetermined array.

By means of this arrangement the balls are placed in the desired predetermined array before the ball pick head is moved towards the balls to pick them for transfer to a final position. In this way the problems associated with the ball pick head collecting balls from a large supply reservoir containing a large number of balls are substantially eliminated or at least mitigated.

In a preferred embodiment of the invention the intermediate position comprises a template having a plurality of ball receiving locations disposed in the predetermined array. Preferably each ball receiving location is formed with means for locating a ball therein, which means may comprise each ball receiving location being formed as a recess sized to receive a substantial part of a ball therein. Preferably each ball receiving location is connected to a source of suction to hold a ball received therein.

The ball supply means may be formed adjacent the intermediate position, and it is particularly preferred that the ball supply means and the intermediate position are formed integrally as part of a single unit. This single unit may be a container, the ball supply means comprising a recessed portion thereof, and the intermediate position may be provided on a planar surface of the container. In this embodiment balls may be transferred from the supply means to the intermediate position by motion of the single unit. This motion may be a reciprocating swinging motion about an axis extending parallel to long axes of the supply means and the intermediate position.

The present invention is in its preferred forms particularly well adapted for supplying solder balls to a ball grid array package.

According to the present invention therefore there is provided apparatus for supplying solder balls to a ball grid array, comprising: supply means for holding a supply of solder balls, means for transferring solder balls from said supply means to an intermediate position in which said solder balls are disposed in a predetermined array corresponding to said ball grid array, and means for transferring said solder balls from said intermediate position to a ball grid array while remaining disposed in said predetermined array.

According to a further aspect of the present invention there is provided a method of supplying balls in a predetermined array, comprising: providing supply means for holding a supply of balls, transferring said balls from said supply means to an intermediate position in which said balls are disposed in said predetermined array, and transferring said balls from said intermediate position to a final position while remaining disposed in said predetermined array.

According to a still further aspect of the present invention there is provided a method of supplying solder balls to a ball grid array, comprising: providing supply means for holding a supply of solder balls, transferring said solder balls from said supply means to an intermediate position in which said solder balls are disposed in a predetermined array corresponding to said ball grid array, and transferring said solder balls from said intermediate position to a ball grid array while remaining disposed in said predetermined array.

Figure 2:
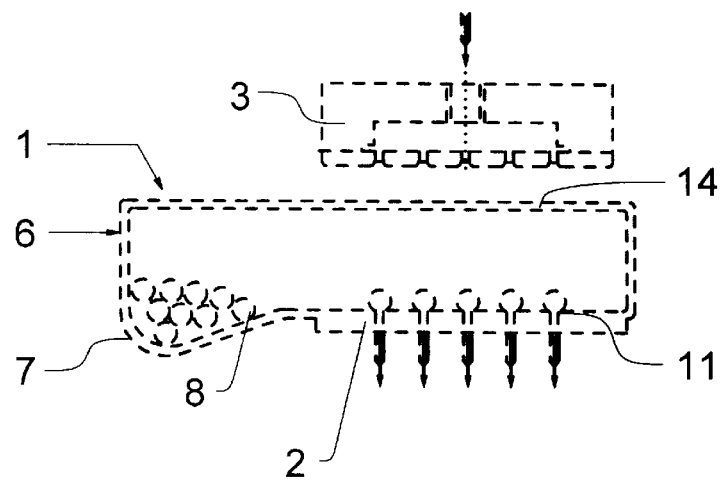
Figure 3:
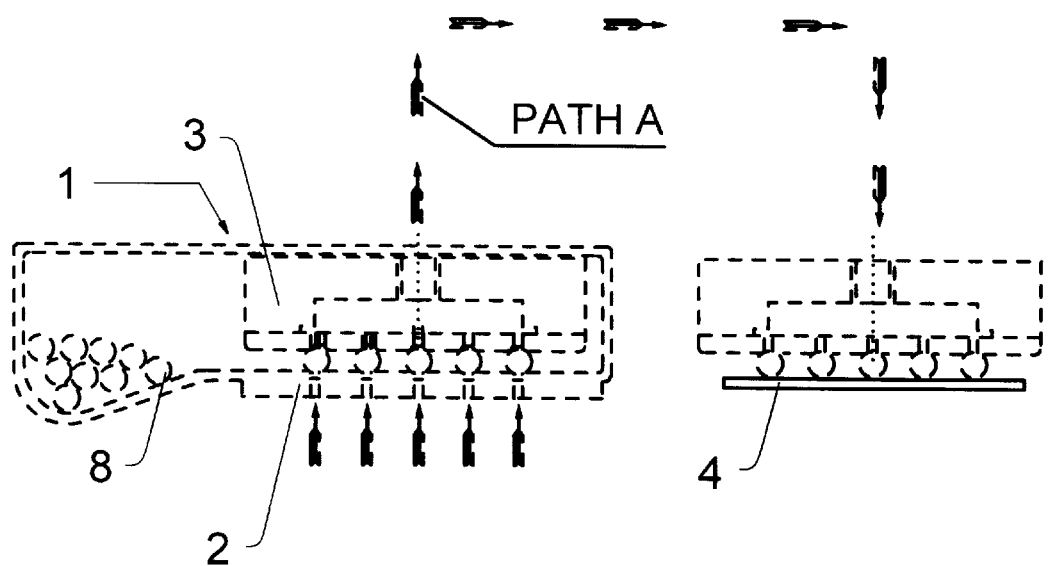
Figure 4:
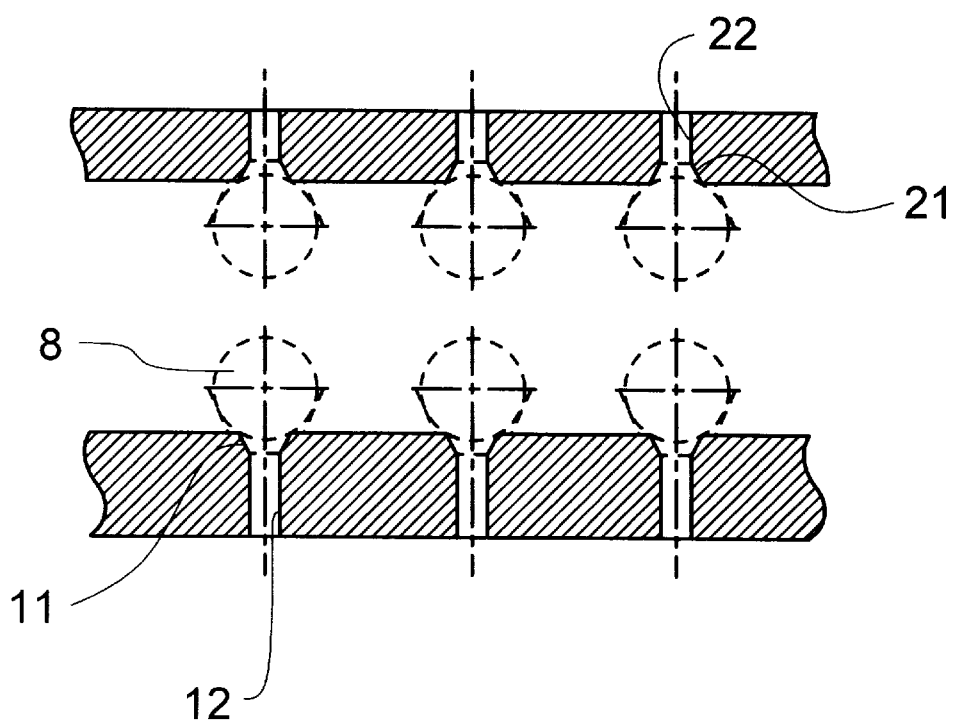

An embodiment of the invention will now be described by way of example and with reference to the accompanying drawings, in which:

FIG. 1 is a perspective view of apparatus according to a first embodiment of the present invention, FIG. 2 is a sectional view through a ball supply unit and ball pick head, FIG. 3 illustrates the method according to this embodiment of transferring balls from the ball supply unit to the substrate via the ball pick head, and FIG. 4 shows in detail how the balls are held in place during the transfer operation.

Referring firstly to FIG. 1 there is shown apparatus for transferring solder balls onto a BGA substrate according to a first embodiment of the invention. In FIG. 1 there is shown a ball supply unit 1 which includes a ball template 2, a ball pick head 3, and a BGA substrate 4 supported on a BGA holder 5.

Ball supply unit 1 comprises a generally rectangular container 6 formed with a curved recessed portion 7 for receiving a supply of solder balls 8, and a ball template 2. Ball template 2 comprises a plurality of ball receiving portions 10 each comprising a number of individual ball locating means 11 as will be described in more detail below. The pattern of the ball receiving portions 10 and ball locating means 11 corresponds to the pattern of the final array on the BGA substrate 4 as will be explained below.

The rectangular container 6 of the ball supply unit is mounted in a frame 9 for rotation about its long axis. It will be understood that this long axis is parallel to the length with direction of the recessed ball receiving portion 7 and parallel to the length wise direction of the ball template 2, and it will also be understood that the ball receiving portion 7 and the template 2 are on opposed sides of the long axis of the rectangular container 6. Handle 13 is provided for enabling the container 6 to be swung back and forth about the long axis. Alternatively means may be provided for the automated movement of the container about the long axis.

It will be understood that as the rectangular container 6 is rotated back and forth about the long axis in the directions shown by the arrows in FIG. 1, solder balls 8 are transferred from the ball receiving portion 7 onto the template 2 where they are received in the locating means 11. FIG. 2 shows a cross-section through the ball supply unit 1 and it will be seen that the ball template 2 comprises a plurality of individual ball locating means 11 comprising recesses formed on the surface of the template 2 for locating a ball, one ball being located in one respective locating means, and through bores 12 associated respectively with each locating means 11 for connecting the locating means 11 to a source of vacuum. In this way it will be understood that once the balls 8 are located on their individual ball locating means 11 in the template, they are held in place by vacuum and will not be dislodged from the template during subsequent rotation of the container 6. Alternatively it may be possible for the solder balls 8 to be held in place simply by gravity alone.

The rectangular container 6 is therefore swung gently about the long axis once or repeatedly until all the ball locating means in the ball receiving portions 10 of the ball template 2 are fully occupied by respective solder balls 8. A number of swinging motions may be necessary, while the balls 8 already located in the locating means 11 are not lost dislodged during further swinging motions because they are held there by the suction that is generated. In passing, it will be understood here that while the ball supply unit 1 is shown in FIG. 1 as being open on the upper side, this is for purposes of clarity and a removable lid 14 (FIG. 2) may preferably be provided to enclose the solder balls 8 so that no solder balls 8 are lost from the supply unit 1 during this swinging motion.

Once the solder balls 8 are properly located on the ball template 2, the removable lid 14 is removed and the ball pick head 3 is moved into a position above the ball template 2. The ball pick head is formed with ball receiving portions 20 each comprising a number of individual ball locating means 21. The ball receiving portions 20 and locating means 21 of the ball pick head are identical in number and distribution to the corresponding ball receiving portions 10 and individual ball locating means 11 of the ball template 2. Ball locating means 21 of the ball pick head 3 are also formed with bores 22 that connect to a source of vacuum in a manner similar to the locating means 11 of template 2.

FIG. 4 shows in detail the shape of the ball locating means 11,21 of the ball template 2 and the ball pick head 3 respectively. The precise shape of the locating means 11,21 is not critical and the geometries can vary. Preferably, however, the locating means 11,21 are cone-shaped. It is also preferred that the locating means 11 on the template 2 be relatively deep so that substantially all (eg more than half) of a solder ball 8 may be received therein. This is to provide additional protection against a solder ball 8 from being dislodged from a locating means 11 while the container 6 is being rotated. The locating means 21 on the ball pick head do not need to be so deep since the ball pick head is not subject to the same lateral rocking or swinging movements as the template 2.

Once the solder balls 8 have been transferred to the ball template 2, the ball pick head 3 is moved to a position exactly overlying the ball template 2 and in exact alignment therewith. A number of alignment techniques are well-known in the art and will not be described here in detail. The solder balls 8 on the template 2 are then transferred to the ball pick head 3 by supplying to the ball locating means 21 of the ball pick head 3 a greater vacuum than is supplied to locating means 11 of the template 2. Indeed the vacuum supplied to the template 2 may be removed completely. In this way the solder balls 8 are then transferred to the ball pick head 3.

Following this transfer the ball pick head 3 moves along the path A indicated in FIG. 3 and is brought into exact alignment with the BGA substrate 4. Again a number of conventional alignment techniques are well-known in the art for enabling the ball pick head 3 to be correctly aligned over the BGA substrate 4. The solder balls 8 are then released from the ball pick head 3 onto the BGA substrate 4 by releasing the vacuum supplied to the ball pick head 3.

By means of the present invention the solder balls are placed in the desired position configuration corresponding to the ball grid array on the template prior to being collected by the ball pick head for transfer to the ball grid array structure. In this way the problems associated with the prior art arrangements in which a ball pick head is lowered into a supply reservoir containing a large number of balls are avoided or at least mitigated. In particular one ball is positioned per ball receiving location of the ball pick head, and is positioned correctly, such that there is a greater degree of likelihood that when the balls are picked up by the ball pick head each ball receiving location of the ball pick head has exactly one ball located therein.

What is claimed is:

1. Apparatus for supplying balls in a predetermined array, comprising: supply means for holding a supply of balls, means for transferring balls from said supply means to an intermediate position integral with said supply means in which said balls are disposed in said predetermined array, and means for transferring said balls from said intermediate position to a final position while remaining disposed in said predetermined array.

2. Apparatus as claimed in claim 1 wherein said intermediate position comprises a template having a plurality of ball receiving locations disposed in said predetermined array.

3. Apparatus as claimed in claim 2 wherein each said ball receiving location is formed with means for locating a ball therein.

4. Apparatus as claimed in claim 3 wherein each ball receiving location is formed as a recess sized to receive a substantial part of a ball therein.

5. Apparatus as claimed in claim 3 wherein each ball receiving location is connected to a source of suction to hold a ball received therein.

6. Apparatus as claimed in claim 1 wherein said ball supply means is formed adjacent said intermediate position.

7. Apparatus as claimed in claim 6 wherein said ball supply means and said intermediate position are formed integrally as part of a single unit.

8. Apparatus as claimed in claim 7 wherein said single unit is a container, said ball supply means comprising a recessed portion thereof, and said intermediate position being provided on a planar surface of said container.

9. Apparatus as claimed in claim 7 wherein balls are transferred from said supply means to said intermediate position by motion of said single unit.

10. Apparatus as claimed in claim 9 wherein said motion is a reciprocating swinging motion about an axis extending parallel to long axes of said supply means and said intermediate position.

11. Apparatus as claimed in claim 1 for supplying solder balls to a ball grid array package.

12. Apparatus for supplying solder balls to a ball grid array, comprising: supply means for holding a supply of solder balls, means for transferring solder balls from said supply means to an intermediate position integral with said supply means in which said solder balls are disposed in a predetermined array corresponding to said ball grid array, and means for transferring said solder balls from said intermediate position to a ball grid array while remaining disposed in said predetermined array.

* * * * *